(12) United States Patent
Sekiguchi et al.

(10) Patent No.: US 10,121,633 B2
(45) Date of Patent: Nov. 6, 2018

(54) ENERGY DISCRIMINATING ELECTRON DETECTOR AND SCANNING ELECTRON MICROSCOPE USING THE SAME

(71) Applicant: NATIONAL INSTITUTE FOR MATERIALS SCIENCE, Ibaraki (JP)

(72) Inventors: Takashi Sekiguchi, Ibaraki (JP); Hideo Iwai, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 0 days.

(21) Appl. No.: 15/513,231

(22) PCT Filed: Sep. 17, 2015

(86) PCT No.: PCT/JP2015/076404
§ 371 (c)(1),
(2) Date: Mar. 22, 2017

(87) PCT Pub. No.: WO2016/047538
PCT Pub. Date: Mar. 31, 2016

(65) Prior Publication Data
US 2017/0301512 A1   Oct. 19, 2017

(30) Foreign Application Priority Data

Sep. 24, 2014  (JP) ................................ 2014-193213
Nov. 28, 2014  (JP) ................................ 2014-241309

(51) Int. Cl.
*H01J 37/24*   (2006.01)
*H01J 37/244*  (2006.01)
*H01J 37/28*   (2006.01)

(52) U.S. Cl.
CPC ............ *H01J 37/244* (2013.01); *H01J 37/28* (2013.01); *H01J 2237/05* (2013.01);
(Continued)

(58) Field of Classification Search
CPC .......... H01J 37/05; H01J 37/244; H01J 37/28; H01J 2237/05
See application file for complete search history.

(56) References Cited

U.S. PATENT DOCUMENTS

| | | | | |
|---|---|---|---|---|
| 2009/0200463 | A1* | 8/2009 | Degenhardt | H01J 37/244 250/307 |
| 2013/0126730 | A1* | 5/2013 | Khursheed | H01J 3/26 250/307 |
| 2014/0299769 | A1* | 10/2014 | Okai | H01J 37/244 250/310 |

FOREIGN PATENT DOCUMENTS

| | | |
|---|---|---|
| EP | 2 482 061 | 8/2012 |
| JP | 58-35854 | 3/1983 |

(Continued)

OTHER PUBLICATIONS

Watanabe, Syunya, "Principle and Application of Scanning Electron Microscope", Journal of the Japan Society for Precision Engineering, vol. 77, No. 11, 2011, p. 1021-1026.*

(Continued)

*Primary Examiner* — David E Smith
(74) *Attorney, Agent, or Firm* — Wenderoth, Lind & Ponack, L.L.P.

(57) ABSTRACT

When an electrode (29) such as a grid applied with a negative voltage is installed in front of an objective lens (23), low energy electrons among secondary electrons (25) generated from a sample (24) by an electron beam or the like is reflected by the electrode to come into a detector (22) installed in the sample (24) side, while electrons of higher energy are not detected, since they are not reflected by the electrode. Accordingly, since only the electrons of lower energy of the secondary electrons can be detected by discriminating the secondary electrons by the energy, it is (Continued)

possible to obtain a detection signal, e.g., rich in the information on the surface state of the sample.

16 Claims, 13 Drawing Sheets

(52) U.S. Cl.
CPC ... *H01J 2237/053* (2013.01); *H01J 2237/057* (2013.01); *H01J 2237/2448* (2013.01); *H01J 2237/24485* (2013.01)

(56) References Cited

FOREIGN PATENT DOCUMENTS

| | | | |
|---|---|---|---|
| JP | 62-150642 | | 7/1987 |
| JP | 62150642 | A * | 7/1987 |
| JP | 62-184752 | | 8/1987 |
| JP | 1-264153 | | 10/1989 |
| JP | 01264153 | A * | 10/1989 |
| JP | 10-188883 | | 7/1998 |
| JP | 10188883 | A * | 7/1998 |
| JP | 11-144656 | | 5/1999 |
| JP | 2002-203507 | | 7/2002 |
| JP | 2003-157790 | | 5/2003 |
| JP | 2004-361283 | | 12/2004 |
| JP | 2004-362883 | | 12/2004 |
| JP | 2004362883 | A * | 12/2004 |
| JP | 2008-282827 | | 11/2008 |
| WO | 84/00443 | | 2/1984 |
| WO | 2009/043317 | | 4/2009 |

OTHER PUBLICATIONS

Sekiguchi et al., "Low Energy Secondary Electron Detector for SEM", The 62nd JSAP Spring Meeting (2015), with English Translation of Abstract.

Sekiguchi et al., "SEM Observation of p-n junction in semiconductors using fountain secondary electron detector", Superlattices and Microstructures, 99:165-168 (2016).

Cho et al., "Imaging and spectroscopy of secondary electrons from AlN and β-SiAlON ceramics using fountain detector", Superlattices and Microstructures, 99:41-44 (2016).

Sekiguchi et al., "Observation of pn Junctions in Semiconductors using Fountain Detector", The 76th JSAP Autumn Meeting (2015), with English Translation of Abstract.

Sekiguchi et al., "Low-Pass secondary electron detector for outlens scanning electron microscopy", Japanese Journal of Applied Physics, 54:088001-1-088001-3 (2015).

Watanabe, "Principle and Application of Scanning Electron Microscope", Journal of the Japan Society for Precision Engineering, 77(11):1021-1026 (2011), with Partial English Translation.

Kyoritsu Shuppan Co., Ltd., "New Scanning electron microscope", pp. 1-26 (2011), with Partial English Translation.

Japanese Notification of Reasons for Refusal dated Apr. 3, 2018 in corresponding Japanese Patent Application No. 2016-550142 with Machine Translation.

Extended European Search Report dated May 7, 2018 in corresponding European Patent Application No. 15843731.9.

Office Action dated Jul. 3, 2018 in Japanese Application No. 2016-550142, with English translation.

* cited by examiner

FIG. 6
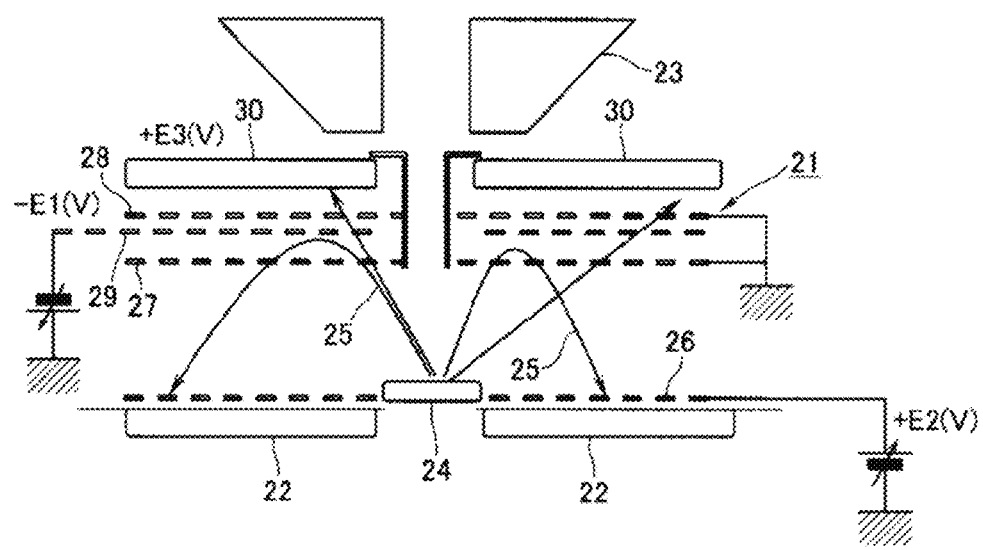
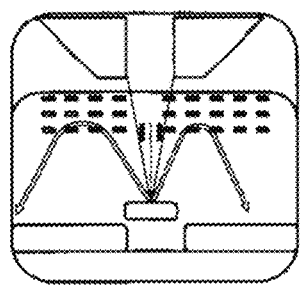
FIG. 7(a)
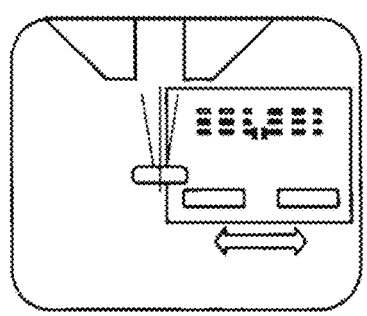
FIG. 7(b)
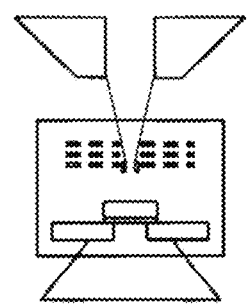
FIG. 7(c)

FIG. 11 (a)
FIG. 11 (b)
FIG. 11 (c)
FIG. 11 (d)
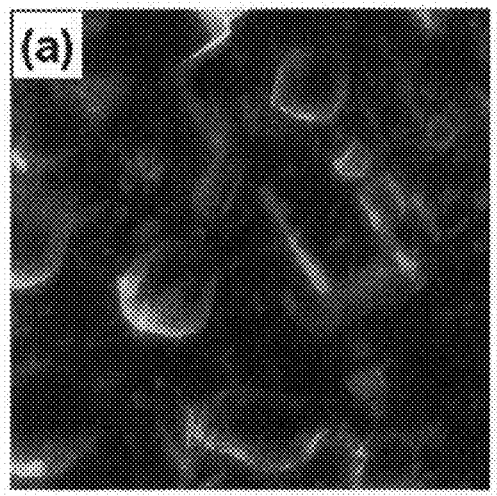
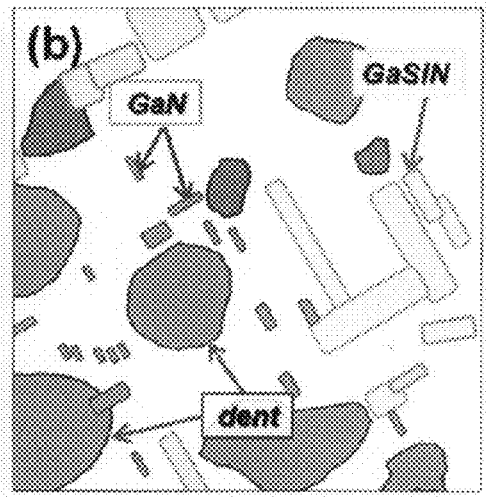
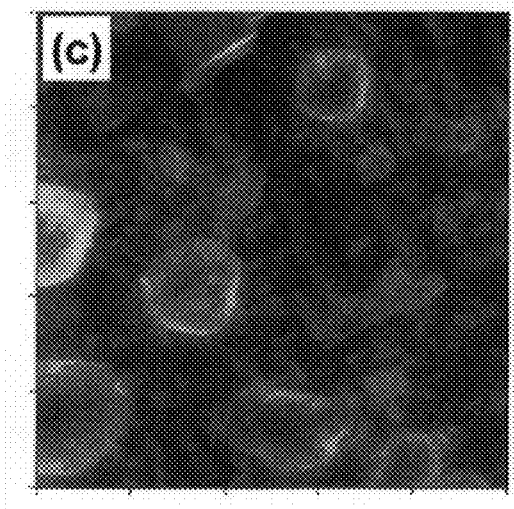
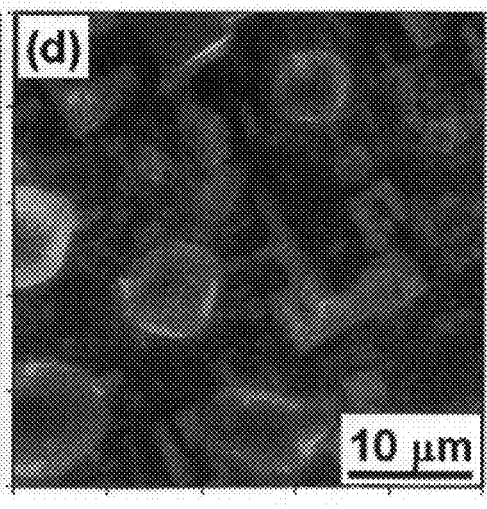

ENERGY DISCRIMINATING ELECTRON DETECTOR AND SCANNING ELECTRON MICROSCOPE USING THE SAME

TECHNICAL FIELD

The present invention relates to energy discriminating electron detector of discriminating and detecting energy of various electrons (hereinafter, represented by secondary electrons) such as secondary electrons, backscattered electrons, or Auger electrons generated from an object by irradiation with an electron beam or an ion beam. The present invention also relates to detection of secondary electrons generated from a sample on the observation of electron microscope images by installing the energy discriminating electron detector as an out-lens detector in a scanning electron microscope (SEM).

The present invention also relates to a scanning electron microscope for more efficiently collecting with a detector the secondary electrons generated by primary electron beam irradiation and allowing observation at a higher accuracy.

BACKGROUND ART

In recent SEMs, electrons emitted from a sample by electron beam irradiation are efficiently guided into an objective lens, and then its electron energy is discriminated so that electrons within a specific energy range may be captured. This electron detection method is called an in-lens detector because of the structure where the detector exists in the lens. By using this detector, selective imaging can be done from the information contained in the secondary electrons, the backscattered electrons or the like, allowing visualization of the information on, e.g., the composition, variation of the surface potential, which have never been visible. This has dramatically expanded the application field of SEM (Non Patent Literature 1).

On the other hand, as another type electron detector, there is an electron detector (out-lens detector, also referred to as an Everhart-Thornley type) which is installed on the wall of a sample chamber between an objective lens and a sample. The out-lens detector has been utilized since the early stage of SEM development, and the out-lens detector is adopted in many general-purpose SEMs. The out-lens detector images the secondary electrons by applying an electric field on the electrode in front there of the detector for collecting the electrons emitted from the sample.

Though it is generally considered that the out-lens detector effectively captures high energy electrons, the high energy electrons emitted from the sample often travel straight and impinge on a wall surface of the sample chamber, resulting in being scattered therefrom or emitting other electrons (these electron are referred to as SE3 electrons), which electrons in turn reach the out-lens detector. For this reason, the out-lens detector cannot recognize the origin of the secondary electrons that contribute to the image, and thus, the out-lens detector has almost always been used for morphological observation.

In addition, since the SE3 electrons has lost the energy on emission from the sample, their original information has been lost, and thus the captured SE3 electrons result in noise. It is noted that, although various pieces of equipment are installed inside the sample chamber of electron microscope, all of those except for the out-lens detector and the sample installed within the sample chamber that do not directly relate to the present invention are regarded as portions of the wall of the sample chamber in the present application, as far as the impingement of secondary electrons and the emission of SE3 are concerned.

As described above, the in-lens detector added with the energy discrimination function has been developed, and the application range thereof has been greatly widened. However, typical out-lens detectors have no energy discrimination function. For this reason, the importance of the out-lens detector is lowered. In addition, examples of the in-lens detectors in cited techniques are disclosed in Patent Literatures 1 and 2.

Furthermore, in a case where a sample of an insulator is observed with an accelerating voltage of about 10 kV, the sample is often negatively charged. However, in the case of observing such a negatively charged sample, since electrons emitted from the sample are affected by charging to be accelerated, trajectories of the secondary electrons are greatly deviated from the direction toward the detector, and thus, a proportion of the electrons directly captured by the out-lens detector is decreased, so that most of the electrons trapped in the out-lens detector become SE3 electrons. This situation is illustrated in FIGS. 1(a) and 1(b). FIG. 1(a) is a diagram illustrating trajectories drawn by secondary electrons having energy of 10 eV emitted from a sample in a case where the sample is charged (−50 V) at slightly lower left from the center in a region having a basically rectangular cross section installed inside a conductor, and FIG. 1(b) is a diagram illustrating trajectories drawn by secondary electrons emitted from a sample in a case where the sample is not charged.

Herein, the potential of an out-lens detector (the protruding distance is the distance from the position of the right wall surface to the center of the slanted distal end of the detector) protruding 75 mm in the left direction from the vicinity of the upper end of the right wall surface is set to +150 V. In addition, the shading of the lines indicating the trajectories represents the emitting direction (angle) of the secondary electrons from the sample. In addition, with respect to the secondary electrons emitted from the same point on the sample in the same direction, the influence from the electric field varies with the energy of the secondary electrons, and the secondary electrons have different trajectories accordingly. In addition, In FIGS. 1(a) and 1(b), around the sample and the detector, lines indicating equipotential surfaces formed around the detector and the sample by such potentials are drawn by light colors (around the detector) and broken lines (around the sample). Herein, since the sample of FIG. 1(b) is not charged, the potential of the sample is the same as that of the surrounding wall surface. Therefore, since the gradient of the potential in the vicinity of the sample is small, broken lines representing an equipotential surface is not drawn around the sample in FIG. 1(b).

As clarified from FIGS. 1(a) and 1(b), the trajectories of the secondary electrons emitted from the charged sample are greatly deviated from the direction toward the detector. Therefore, in the case of observing a sample of an insulator, there is a problem in that the signal intensity is greatly lowered.

CITATION LIST

Patent Literature

Patent Literature 1: JP 11-144656 A
Patent Literature 2: JP 2003-157790 A

Non Patent Literature

Non patent Literature 1: "Principle and Application of Scanning Electron Microscope (Observation, Analysis)"

Journal of the Japan Society for Precision Engineering, Vol. 77, No. 11, 2011, p. 1021-1026

Non Patent Literature 2: "New Scanning Electron Microscope" Kyoritsu Shuppan, 2011, p. 1-26

SUMMARY OF INVENTION

Technical Problem

The present invention is to allow a detector such as an out-lens detector installed outside an objective lens of an electron beam or an ion beam to have an energy discrimination function to selectively detect only electrons in the low energy side among the electrons generated from an object, so that more amount of information on the electrons from the object can be acquired.

In addition, the present invention is also to provide a scanning electron microscope capable of obtaining a more accurate electron microscope image having a sharper image contrast by more efficiently collecting secondary electrons emitted from a sample irradiated with an electron beam and suppressing capturing of SE3 electrons.

In addition, the present invention is also to provide a scanning electron microscope capable of easily observing a sample of an insulator charged with an electron beam.

Solution to Problem

According to one aspect of the present invention, an energy discriminating electron detector is provided that comprises: a main electrode disposed between an energy beam radiating device radiating an electron or ion beam through an objective lens and an object emitting electrons in response to the irradiation of the ion or electron beam, the main electrode being applied with an negative voltage; and an electron detector disposed remotely from the main electrode on the sample side thereof, the electron detector detecting electrons which are those emitted from the object and reflected by the main electrode.

A shield electrode may further be provided that is disposed at least between the main electrode and the object, and shields an electric field caused by the negative voltage applied to the main electrode, wherein the shield electrode on the object side is a grid electrode.

The shield electrode may be disposed on either side of the main electrode.

The main electrode may be planar.

The main electrode may be curved.

The main electrode may be a segment of a spherical surface convex toward the objective lens.

The main electrode may be paraboloidal, and the object may be located at a focal point of the parabolic surface.

The main electrode may be a segment of a spheroidal surface, the object may be located at one focal point of the spheroidal surface, and the electron detector may be located at the other focal point of the spheroidal surface.

An additional main electrode of a grid shape may further be provided between the main electrode and the electron detector and, in a case where the shield electrode is provided, between the shield electrode on the object side and the electron detector, wherein a negative voltage may be applied to the additional main electrode.

An additional electron detector may further be provided on the objective lens side of the main electrode, wherein the main electrode may be in a grid shape, and wherein, in a case where the shield electrode is disposed on the objective lens side of the main electrode, the shield electrode may be a grid-shaped electrode.

The electron detector may comprise a plurality of detection units.

The detection units may be arranged concentrically with respect to an incident direction of the electron beam.

The detection units may be arranged radially with respect to an incident direction of the electron beam.

Some of the detection units may be disposed remotely from each other.

A grid-shaped electrode may further be provided in front of the electron detector to which a positive voltage is applied or which is grounded.

The negative voltage applied to the main electrode may be a DC voltage.

The negative voltage applied to the main electrode may be a DC voltage over which an AC voltage is superimposed, and an output of the electron detector may be differentiatingly amplified.

The main electrode may reflect electrons having energy of 50 eV or less.

The main electrode may reflect electrons having energy of 5 eV or less.

The main electrode may be cut out around a region through which an electron beam or an ion beam directed toward the object in the main electrode passes.

According to another aspect of the present invention, a scanning electron microscope is provided, wherein any one of the above-mentioned energy discriminating electron detector is used as an out-lens detector, and wherein the object is a sample to be measured.

The reflective electrode and the detector may be configured to be movable in a sample chamber.

The reflective electrode and the detector may be detachably attached to a sample stage on which the sample is mounted. An electron trajectory control mechanism as well as an optical system two-dimensionally scanning the sample with the electron beam and a sample chamber containing the sample may further be provided so that the electron trajectory control mechanism may modify trajectories of the secondary electrons so as to suppress generation of SE3 electrons due to impingement of the secondary electrons emitted from the sample by irradiation of the electron beam on a wall surface of the sample chamber and to guide the secondary electrons to an out-lens detector.

The mechanism may be configured by an electrode disposed on the wall surface of the sample chamber, and the generation of the SE3 electrons may be suppressed and trajectories of the secondary electrons may be modified by controlling a potential of the electrode.

The mechanism may be configured by an electrode constituting a wall itself of the sample chamber, and the generation of the SE3 electrons may be suppressed and trajectories of the secondary electrons may be modified by controlling a potential of the electrode.

The mechanism may be configured by an electrode disposed in the sample chamber, and the generation of the SE3 electrons may be suppressed and trajectories of the secondary electrons may be modified by controlling a potential of the electrode.

The electrode may be arranged as a plurality of divisions, and potentials of the electrodes may be individually controllable.

The electron trajectory control mechanism may selectively guide to the out-lens detector an electron having a desired emitting angle among the secondary electrons emitted from the sample.

Advantageous Effects of Invention

In the present invention, only low energy ones among secondary electrons and the like generated from an irradiation object of an electron beam or an ion beam is discriminated and detected, so that it is possible to easily extract and detect only information held by these electrons of the low energy ones. In particular, by applying the present invention to a SEM, it is possible to obtain an effect in that a surface image of a sample can be clearly observed.

In addition, according to the present invention, since the electron trajectory control mechanism for suppressing the generation of the SE3 electrons due to the secondary electrons emitted from the sample by the irradiation with the electron beam impinging on the wall surface of the sample chamber and correcting the trajectories of the secondary electrons so that the secondary electrons are guided to the out-lens detector is provided, the capturing of the SE3 electrons is suppressed, and the secondary electrons can be more effectively captured by the out-lens detector, so that it is possible to obtain a more accurate electron microscope image having a small noise and a sharper image contrast.

Furthermore, according to the present invention, it is possible to easily observe a sample of an insulator charged by an electron beam, which has had difficulty in the related art.

BRIEF DESCRIPTION OF DRAWINGS

FIG. 6 is a conceptual diagram of an embodiment of the present invention illustrating an embodiment of the present invention where electron detectors are installed above and below a reflective electrode.

FIGS. 7(a) to 7(c) are conceptual diagrams illustrating examples of aspects of installation of the device of the first embodiment inside a sample chamber.

FIG. 8(a) shows a SEM image based on typical secondary electrons, and FIG. 8(b) shows a SEM image based on low-pass secondary electrons.

FIG. 9(a) shows a SEM image based on low-pass secondary electrons, and FIG. 9(b) shows a SEM image based on high-pass secondary electrons.

FIGS. 11(a) to 11(d) show secondary electron images of other samples, FIG. 11(a) shows a secondary electron image in a case where an ET type detector in the related art is used, FIG. 11(b) shows a secondary electron image in a case where E1=−10 V and E2=0 V in the device of the second embodiment, FIG. 11(c) shows a secondary electron image in a case where E1=−60 V and E2=0 V in the device of the second embodiment.

FIG. 12(a) shows a secondary electron image in a case where an ET type detector in the related art is used as an electron detector, and FIGS. 12(b) and 12(c) show an secondary electron image in a case where E1=−10 V and E2=0 V and an secondary electron image in a case where E1=−60 V and E2=0 V, respectively, in the configuration of the device of FIG. 2.

DESCRIPTION OF EMBODIMENTS

Figure 1A:
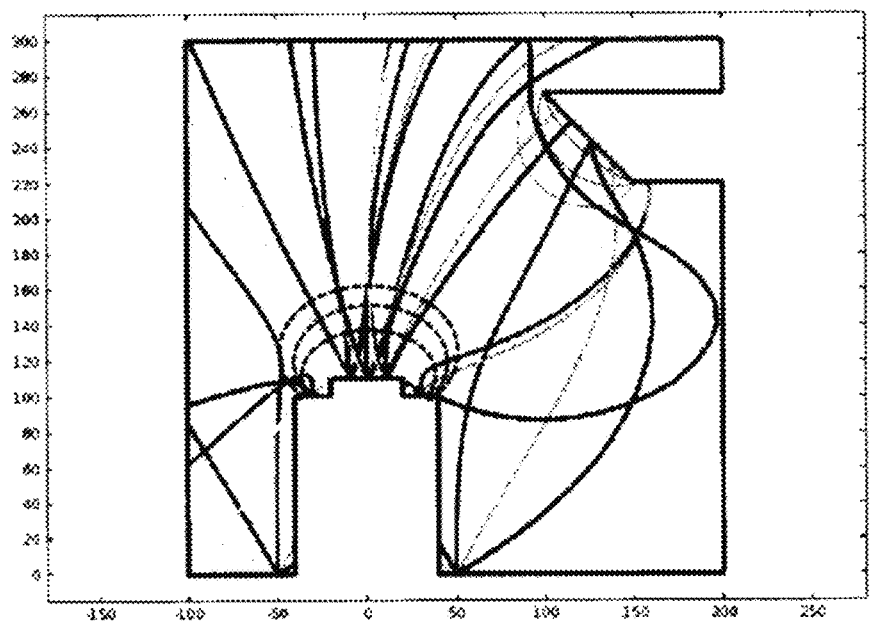
FIG. 1(a) is a diagram illustrating trajectories drawn by secondary electrons with energy of 10 eV emitted from a sample in a case where the sample is charged to −50 V.
Figure 1B:
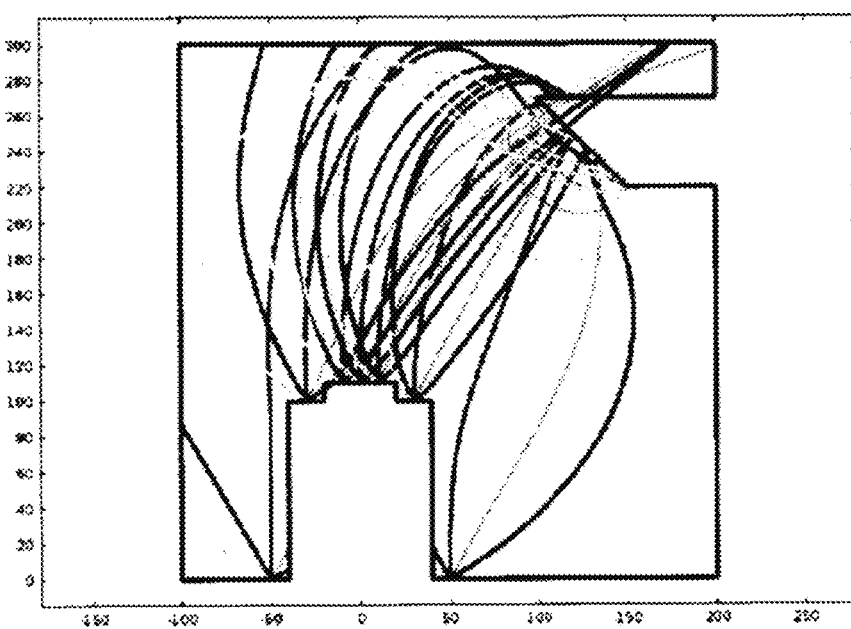
FIG. 1(b) is a diagram illustrating trajectories drawn by secondary electrons emitted from a sample in a case where the sample is not charged. The unit of vertical and horizontal scales in the outsides of the figures is mm.

Hereinafter, embodiments where the present invention is applied to a secondary electron detection system of a SEM will be exemplified and described, but it should be noted that generality is not lost by the embodiments. In addition, although various electrons can be generated by irradiating an object with an ion beam from an objective lens through an optical system for the ion beam, the present invention can be applied to a configuration utilizing the ion beam irradiation.

In a first embodiment where the present invention is applied to the secondary electron detection system of the SEM, energy of electrons trapped in an out-lens detector is discriminated, and an amount of information in an output signal of the out-lens detector is increased. In this embodiment, particularly, it is important to form a low pass filter in the sense that one having a lower energy is selected in the secondary electron detection system. Therefore, it is possible to qualitatively interpret the microscope image of the out-lens detector which has been used for morphological observation in the related art as a composition image or a potential image, and the application range of the microscope observation is widened. Typically, low energy electrons in such a type of secondary electrons denote electrons having energy of about 50 eV or less. The present invention exhibits large effects as described below by discriminating and detecting only the low energy electrons. Furthermore, by discriminating electrons having a lower energy of 5 eV or less, it is possible to acquire information contained by the electrons in the energy band.

In this embodiment, an electrode (reflective electrode) to which a negative voltage is applied is installed between the sample and the electron microscope objective lens which irradiates the sample with the electron beam. The secondary electrons generated from the sample are mainly directed from the sample toward the objective lens side. Among such secondary electrons, the low energy secondary electrons are reflected therefrom by the electric field according to the negative voltage of the reflective electrode to be returned to the sample side. By detecting the low energy secondary electrons returned to the sample side by using the electron detector installed in the sample side, among the secondary electrons in the wide energy band generated from the sample, only the low energy secondary electrons can be discriminated and detected. In this sense, it can be said that, in the embodiment, the detection can be performed by applying a low pass filter to the secondary electrons generated from the sample.

In the simplest example of cases where this embodiment is applied to a SEM, a flat reflective electrode for electron spectroscopy and a flat electron detector facing the flat reflective electrode are arranged between the objective lens and the sample in the sample chamber of the SEM. With the combination, the energy of electrons detected by the electron detector is discriminated according to the voltage applied to the reflective electrode.

Figure 2:
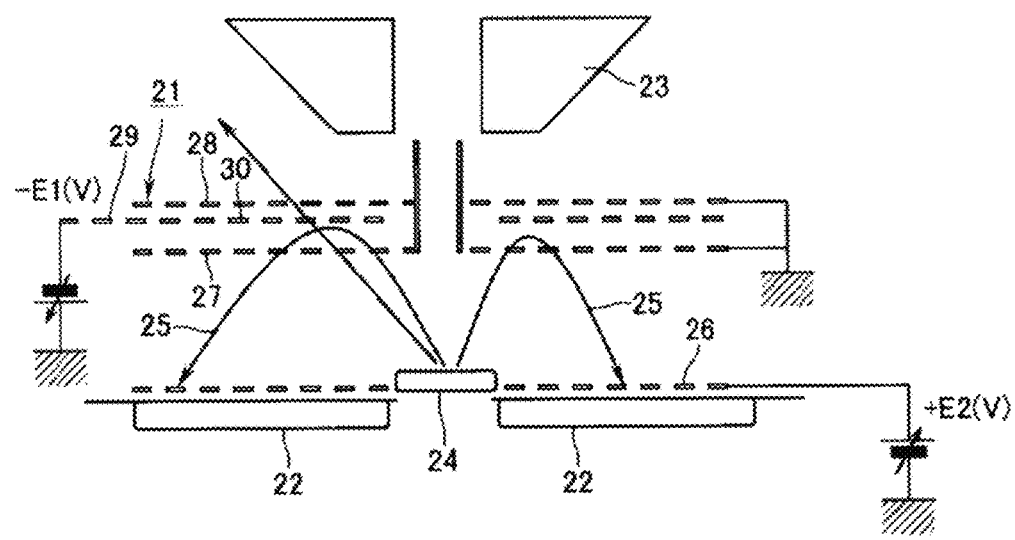
FIG. 2 is a conceptual diagram of a first embodiment of the present invention using a planar electrode as a reflective electrode.

FIG. 2 conceptually illustrates arrangement of a reflective electrode 21 and an electron detector 22 according to the embodiment. In this configuration, secondary electrons 25 generated from a sample 24 travel upward by electron beam irradiation (not illustrated) from an objective lens 23 of the electron microscope, but due to a negative voltage (−E1) applied to the reflective electrode 21, the electrons having energy of which absolute value is equal to or less than E1 are pushed back downward to be captured by the electron detector 22 applied with zero potential or a positive voltage (+E2). This configuration serves as a low pass filter for the secondary electrons 25. Since the electrons captured by the electron detector 22 are electrons having an absolute value of E1 (V) or less, a low energy secondary electron image can be obtained. By increasing the absolute value E1 of the negative voltage applied to the reflective electrode 21, high energy secondary electron components and reflection electron components can also be detected. A passage through which the electron beam from the objective lens 23 passes is installed at the center of the reflective electrode 21. In a case where the above-described positive voltage (+E2) is to be applied to the electron detector, a grid 26 to which the positive voltage is applied is installed immediately in front of the electron detector 22 in FIG. 2, as the configuration for this purpose. This is a configuration for improving detection sensitivity by accelerating toward the electron detector 22 the low energy electrons 25 that have got closer to the electron detector 22.

As the electron detector 22, for example, an MCP (microchannel plate) detector can be used, but the electrons can be detected by other electron detectors such as an ET type detector and a semiconductor detector.

Figure 3A:
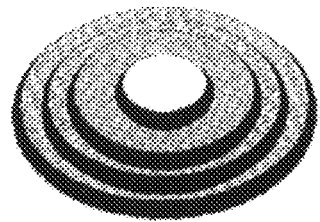
FIGS. 3(a) and 3(b) are conceptual diagrams of examples of division of an electron detector.
Figure 3B:
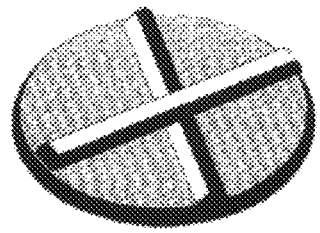

By dividing a detection surface of the electron detector into a plurality of detection units such as ring shapes or fan shapes, it is also possible to identify emitting directions and energy of the secondary electrons. FIGS. 3(a) and 3(b) illustrate examples of the division of the electron detector. FIG. 3(a) illustrates an example of concentric division, and FIG. 3(b) illustrates an example of fan-shaped division by a plurality of straight lines passing through the center of the electron detector. The electrons are detected for each section (detection unit) of the division. In addition, FIGS. 3(a) and 3(b) illustrate only the configuration where a plurality of the sections of the electron detector are connected to each other to be apparently integrated. However, at least a portion of the plurality of sections may be arranged to be separated from each other, and these sections may be distributed in the plane which the secondary electrons may reach. In addition, instead of using a plurality of divided electron detectors, a position-sensitive electron detector is adopted to detect electrons incident on the electron detector for each position on the detection surface, so that the same function can be realized.

Figure 4:
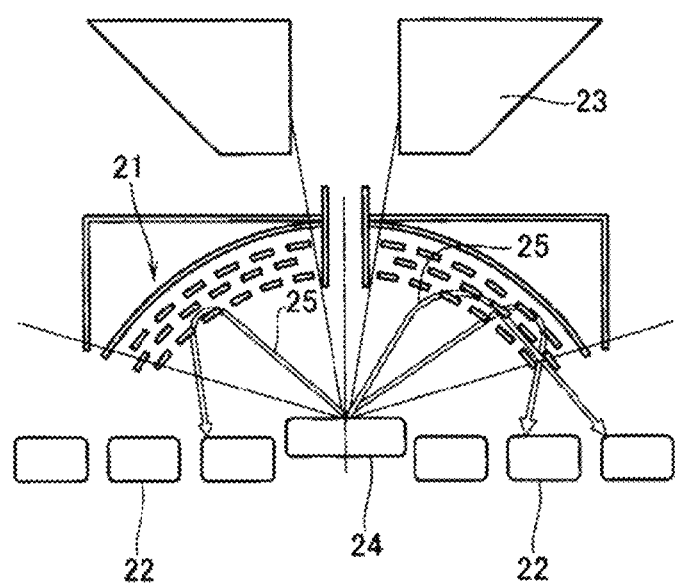
FIG. 4 is a conceptual diagram of an embodiment of the present invention having a spherical electrode and a structure of acquiring secondary electrons which are simultaneously decomposed according to angle and energy by using a concentric division detector.

Also, by dividing the electron detector in accordance with the trajectories of the secondary electrons, it is possible to acquire a secondary electron signal which is simultaneously decomposed according to angle and energy. For example, when a concentric division electron detector illustrated in FIG. 3(a) is used, in the same energy, the secondary electrons emitted at a lower angle are detected as it goes outward. By using the configuration, it is possible to acquire a secondary electron image or spectrum which is simultaneously decomposed according to angle and energy. FIG. 4 illustrates a conceptual diagram of a spherical electrode and a structure of acquiring secondary electrons which are simultaneously decomposed according to angle and energy by using a concentric division detector.

In order to irradiate the sample 24 with the electron beam from the objective lens 23, the reflective electrode 21 is configured to be in a donut shape by increasing the diameter of the path of the electron beam installed in the reflective electrode 21, so that, among the secondary electrons 25 from the sample 24, the secondary electrons directed toward the reflective electrode 21 at an angle close to the direction opposite to the direction of the incident electron beam are directed toward the objective lens 23 side through the large-diameter passage, and thus, the secondary electrons are not reflected. In this manner, the secondary electrons in a specific angle range (in the above example, the angle range of from the angle of 0° with respect to the electron beam direction to the angle determined by the diameter of the passage and the distance to the reflective electrode 21) are not allowed to be reflected by cutting off the reflective electrode 21, so that it is also possible to extract the secondary electrons in a specific angle range.

Furthermore, in a case where an MCP detector is used as the electron detector 22, a grid-shaped electrode may be installed in front of the MCP, a negative voltage (−E3) is applied thereto, and the electron detector 22 can be used as a band pass filter covering from E3 (V) to E1 (V). In addition, similarly to the reflective electrode 21, shield electrodes for electrostatic shielding corresponding to the shield electrodes 27, 28 may be installed in one side or both sides of the grid-shaped electrode. In this case, the shield electrode corresponding to the shield electrode 27 also needs to be in a grid shape so that the electrons directed toward the electron detector 22 can pass therethrough.

In FIG. 2, the reflective electrode 21 is illustrated as three mutually parallel broken lines. However, this is a configuration for performing electrostatic shielding for localizing the electric field for reflecting the low energy electrons by the negative voltage −E1 applied to the central main electrode 29 between the grounded shield electrodes 27 and 28 of the both sides. Due to the electrostatic shielding, the electric field according to the voltage applied to the main electrode 29 is allowed not to influence the trajectories of the low energy electrons between the main electrode 29 and the electron detector 22 in a manner different according to the position, shape, and size of the sample, the state of charging, and other devices in the sample chamber. Therefore, by adopting the configuration, the design and operation control of the device of this embodiment are facilitated. Between the two shield electrodes 27 and 28, the effect of the electrostatic shield by the shield electrode 27 in the sample side is greater in order not to influence the electric field from the main electrode 29 on the motion of the electrons when the electrons reflected on the reflective electrode 21 move away toward the electron detector 22. However, as described later, in the case of applying an AC to the main electrode 29, in order to prevent the AC from being introduced to the electric signal as the measurement result, the shield electrode 28 in the opposite side, that is, the objective lens 23 side is also important.

Herein, in order to allow the secondary electrons 25 returned from the sample 24 to pass through to reach the vicinity of the main electrode 29, the shield electrode 27 in the sample side needs to be formed in a grid shape having a physical hole for passing electrons. On the contrary, if there is no need to pass electrons, the main electrode 29 and the shield electrode 28 in the objective lens 23 side may be in a grid shape or may be a plate-shaped electrode without holes. In addition, as described below, in a case where an electron detector is also installed in the objective lens 23 side of the reflective electrode 21 to perform a high-pass filter operation for detecting the electrons in the high energy side, the main electrode 29 and the shield electrode 28 in the objective lens 23 side also need to be in a grid shape. Also, as described below, even in a case where the shape of the reflective electrode 21 is one of various curved surfaces, although not individual described, whether each electrode needs to be in a grid shape or whether the holes for allowing the electrons to pass through needs to be installed are the same as those the case of the planar shape described above. In addition, in FIG. 2, although all of the electrodes are illustrated as grids, it should be noted that the figure illustrates a specific example, but there is no intention to limit the present invention only to the case of a grid.

Figure 5:
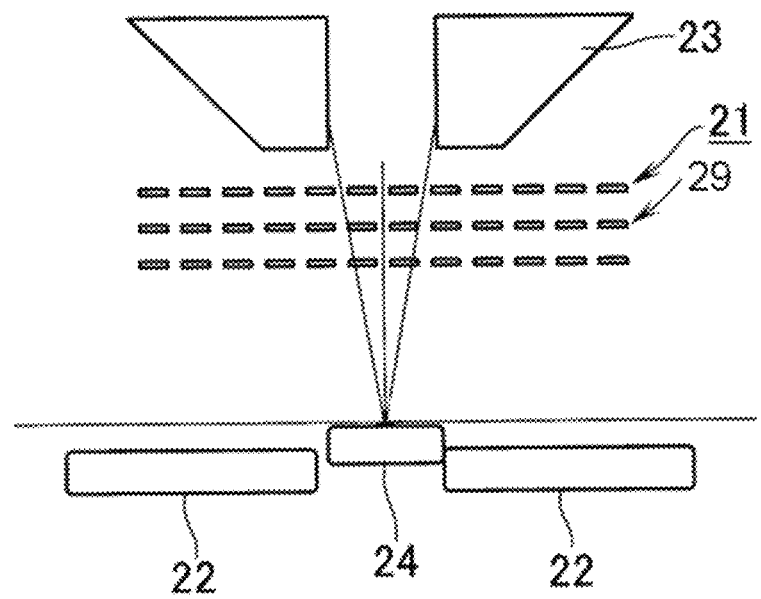
FIGS. 5(a) and 5(b) are conceptual diagrams illustrating an embodiment of the present invention using a planar electrode as a reflective electrode and an embodiment of the present invention using a spherical electrode in a comparison manner.
Figure 5:
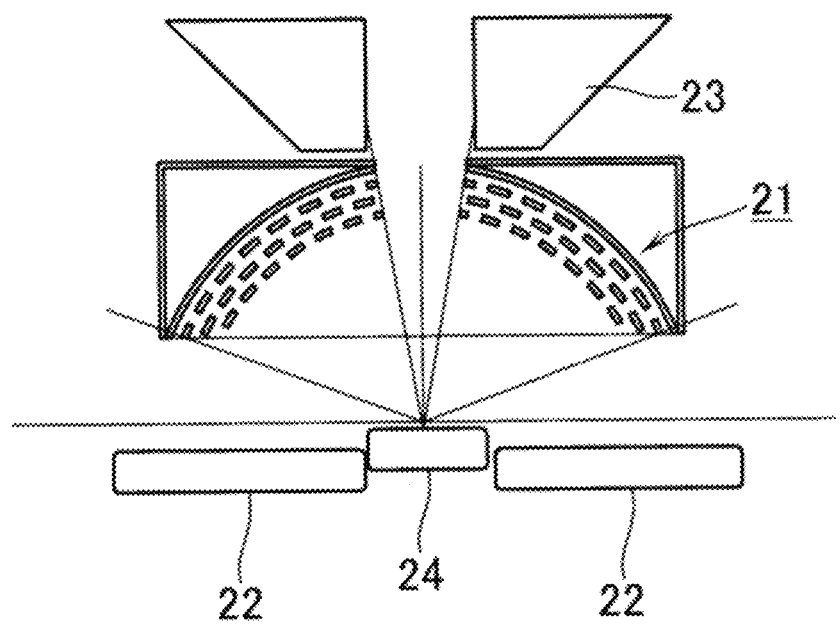

The shape of the reflective electrode 21 may not only be planar one but also curved in consideration of the trajectories of the electrons. Furthermore, as described with respect to the planar electrode in FIG. 2, by configuring a plurality of reflective electrodes, it is also possible to improve the energy discrimination ability and to suppress the leakage of the electric field to the outside (electrostatic shield). Accordingly, the energy discrimination function is improved. FIG. 5(a) illustrates a conceptual diagram of a planar electrode configuration, and FIG. 5(b) illustrates a conceptual diagram of a spherical electrode configuration which is convex toward the objective lens side as an example of the curved surface electrode configuration.

In a case where a planar electrode is used, the incident angle of the secondary electrons 25 generated from the sample 24 on the reflective electrode 21 is small adjacent to the right above position of the sample 24, and increases as moving therefrom toward the periphery. Even though the potential of the reflective electrode 21 is constant irrespective of the position, if the incident angle of the electrons is different, the upper limit value of the energy of the electrons reflected thereon is changed. However, as illustrated in FIG. 5(b), by configuring the reflective electrode 21 to convex toward the objective lens 23 side, namely, by configuring a spherical surface of which center is directed toward the sample 24, the incident angle of the electrons from the sample 24 on the reflective electrode 21 is not greatly changed between the center and the periphery, so that the cutoff value of the low-pass filter function on the secondary electrons 25 becomes constant irrespective of the position of the reflective electrode 21.

Herein, the relative position of the sample and the electron detector in FIG. 2 (and the following figures) will be described. In FIG. 2, the electron detector 22 is illustrated to be positioned slightly below the sample 24 (namely, slightly away from the sample 24 as viewed from the objective lens 23). The reason for the positional relationship is that any obstacle is not allowed to exist on the path along which the secondary electrons emitted from the sample 24, particularly, the secondary electrons emitted at a large angle with respect to the incident electron beam reach the reflective electrode 21. Even though the position of the electron detector 22 is raised up to the same vertical position as the sample 24, it does not become an obstacle to the secondary electron path. However, in a case where the distance from the upper side of sample 24, that is, the electron detector 22 to the objective lens 23 is raised to the position where the distance is smaller than the distance from sample 24 to the objective lens 23, the vicinity of the end portion of the electron detector 22 which is close to sample 24 enters the path of the secondary electrons emitted from sample 24 at a large angle, so that a phenomenon similar to vignetting mentioned in the optical system occurs, and thus, there is a problem in that a portion of the information contained in the secondary electrons is lost. Of course, if the vignetting is not so problematic, the electron detector 22 may be located to some degree above sample 24.

FIG. 6 illustrates an example of a multi-detector configuration where one electron detector is installed at each of positions above and below the reflective electrode. The electron detector 22 on the lower side (the sample side) can be used as a low-pass filter and the electron detector 30 on the upper side (the objective lens 23 side) can be used as a high pass filter by disposing the electron detectors 22 and 30 one above the other with the reflective electrode 21 sandwiched therebetween. The obtained signal can be output as an image for comparison or can be subject to calculation such as difference acquisition.

In addition, the shape of the reflective electrode 21 is not limited to a hemisphere and a flat plate. For example, the shape of the reflective electrode 21 may be a portion of a spheroidal surface. In this case, the secondary electrons emitted from the sample located at one focal point of the spheroidal surface are preferably structured to enter the electron detector 22 located at the other focal point. In addition, if the shape of the reflective electrode 21 is a parabolic surface, the secondary electrons having the same energy travel in parallel after being reflected by the reflective electrode 21, so that it is possible to install the electron detector 22 in accordance therewith.

Another measure than the low-pass and high-pass filter imaging may be used for obtaining a secondary electron image. That is, so called differentiating amplification can be employed where an AC such as $(-E1 - E4 \sin \omega t)$ (wherein $\omega t$ is an angular frequency of the AC) is superimposed over the voltage applied to the reflective electrode 21 to extract and amplify the signal synchronized therewith by means of, e.g., synchronous detection using a lock-in amplifier. The voltage derivative of the secondary electrons having energy of E1 is thus obtained, and the secondary electron spectrum can be reproduced through mathematical calculation. In particular, it is possible to obtain an image in which a region of steep variation in the secondary electron energy spectrum is emphasized.

The above-described signal can be realized by increasing or decreasing the negative voltage applied to the reflective electrode 21 by ΔE5 to acquire two secondary electron images and acquiring the difference between signals of the images. In this case, although the specific value of the voltage ΔE5 to be increased or decreased depends on the resolution of the system, the value can be set to a small value of, for example, about 2 V to 3 V.

By capturing all the secondary electrons 25 emitted upward from the sample 24, it is possible to use the electron detector 22 of this embodiment as an integration sphere of the secondary electrons.

In the device of this embodiment, as illustrated in FIG. 7(a), the reflective electrode and the electron detector can be fixedly installed in the sample chamber of the SEM. However, as illustrated in FIG. 7(b), the reflective electrode and the electron detector may be attached to a moving stage, and only during the measurement, the stage may be moved from a flange or the like installed in the sample chamber up to a position above the sample. Furthermore, as illustrated in FIG. 7(c), the reflective electrode and the electron detector may be structured to be detachable, and as necessary, the reflective electrode and the electron detector may be used in the state that the reflective electrode and the electron detector together with the sample are attached to the sample stage.

Next, a SEM image captured by using the device of this embodiment will be described. Of course, it should be noted that the application of the present invention is not limited thereto.

Figure 8A:
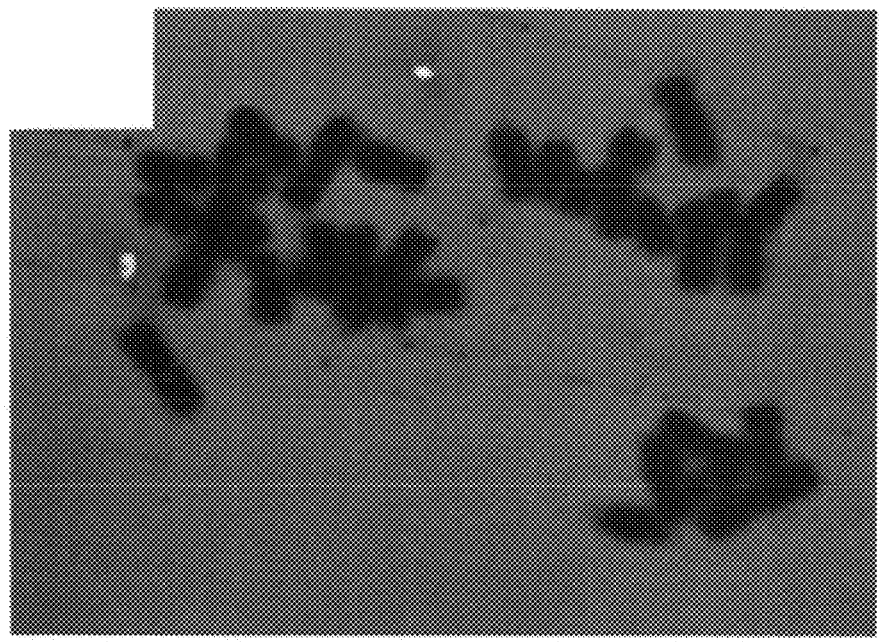
FIGS. 8(a) and 8(b) are pictures showing SEM images of human chromosomes.
Figure 8B:
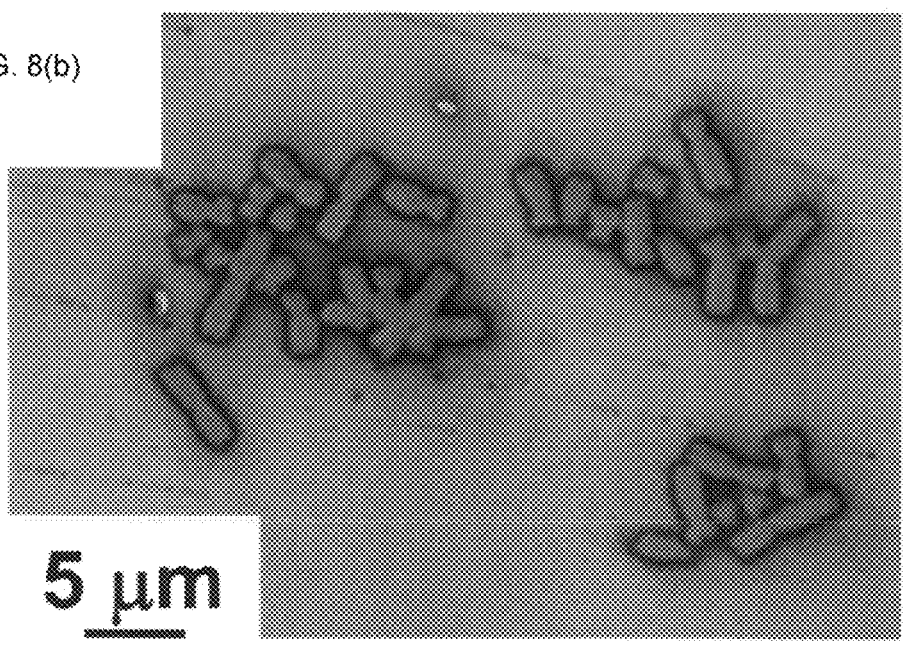

FIGS. 8(a) and 8(b) show secondary electron images of human chromosomes. FIG. 8(a) is a SEM image obtained by a typical secondary electron detector (ET detector), and FIG. 8(b) is a SEM image obtained from a result of low energy secondary electron detection obtained by using the device of this embodiment. The electron microscope images are captured by using a primary electron beam of 5 kV and 1 nA at room temperature. E1=−30 V, and E2=0 V. By comparing the two images, it can be understood that, in FIG. 8(b), the structure of the chromosomes is clearly observed by the low energy secondary electrons emitted from the chromosomes. Since the surface state of the sample is more strongly reflected on the low energy secondary electrons among the secondary electrons generated from the sample in comparison with the high energy secondary electrons, the SEM image in FIG. 8(b) clearly shows the surface of the chromosomes.

Figure 9A:
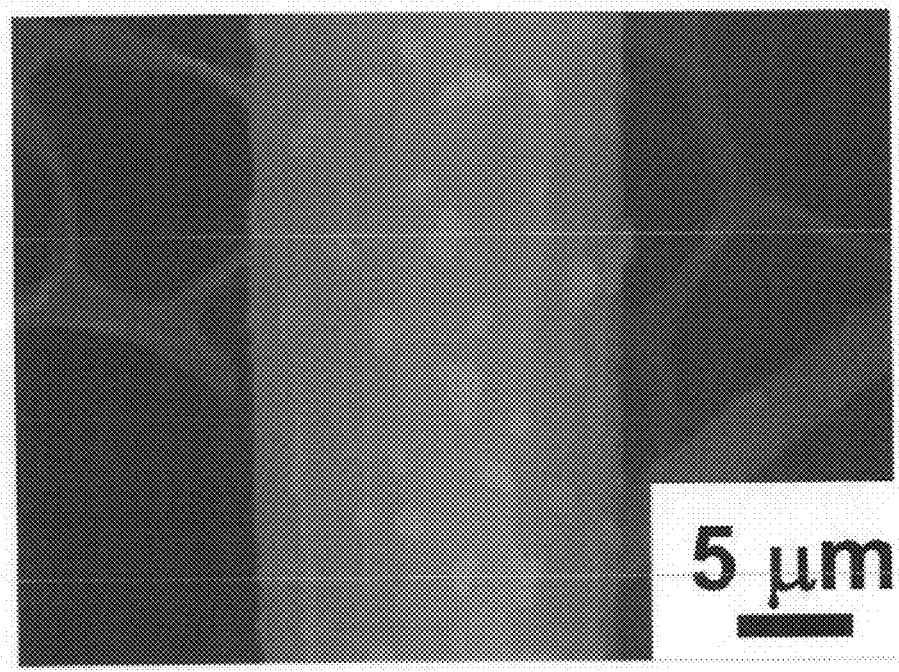
FIGS. 9(a) and 9(b) are SEM images of $SnO_2$ nano-particles embedded in a quartz nano-rod obtained by the device of the first embodiment of the present invention conceptually illustrating the structure in FIGS. 5(a) and 5(b)
Figure 9B:
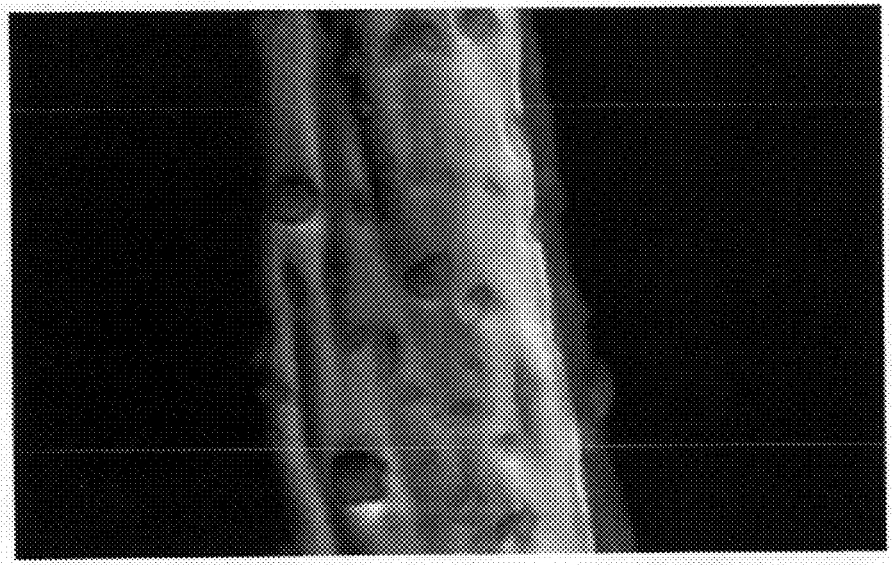

FIGS. 9(a) and 9(b) show examples of energy filter secondary electron images by a plurality of detectors. The sample is $SnO_2$ nano-particles embedded in a quartz nano-rod. FIG. 9(a) is a SEM image by low pass (low energy side) secondary electrons, and FIG. 9(b) is a SEM image by high pass (high energy side) secondary electrons. In FIG. 9(a), the $SnO_2$ nano-particles are clearly observed, but in FIG. 9(b), the nano-particles appear to be transparent.

Figure 10:
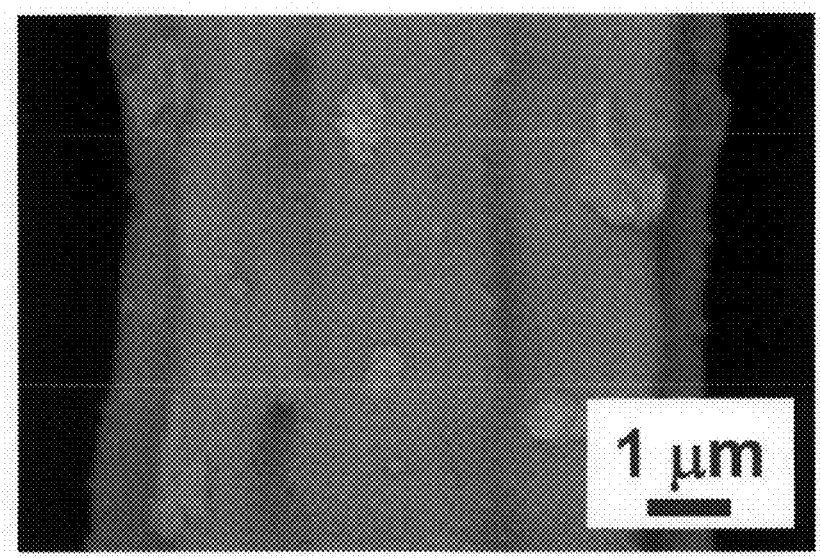
FIG. 10 is a picture showing a SEM image based on secondary electrons differentially amplified from $SnO_2$ nano-particles embedded in a quartz nano-rod.

FIG. 10 shows an example of a secondary electron image obtained by differential amplification obtained by applying an AC potential. The sample is $SnO_2$ nano-particles embedded in a quartz nano-rod. It can be seen that the structure of the surface of nano-particles and nano-rod is emphasized by emphasizing an edge in the image through the differential amplification.

In addition, observation of other samples was performed by the device of this embodiment. The results are shown in FIGS. 11(a) to 11(d) and 12(a) to 12(c) in comparison with the results in a case where the ET type detector in the related art is used.

With the sample, an MnS layer having a thickness of 50 nm is formed on an Si substrate by a sputtering method, GaN having a thickness of 500 nm is formed on the MnS layer by a sputtering method, and GaN with a thickness of 1 μm is further grown by a metal organic chemical vapor deposition (MOCVD) method. The sample is formed by etching the sputtered GaN layer and MnS layer and by forming a small GaN ridge.

Measurement is performed by using a field emission scanning electron microscope (SEM; Hitachi S4300 SE/N). The electron microscope image is captured by using a primary electron beam of 5 kV and 1 nA at room temperature.

FIG. 11(a) shows a secondary electron image of a sample in a case where an ET type detector in the related art is used as an electron detector, and FIG. 11(b) is a schematic diagram thereof. Amorphous dents on the Si and two types of large and small horizontally-arranged triangular prisms (GaSiN and GaN) are observed. FIGS. 11(c) and 11(d) show secondary electron images in a case where {E1=−10 V and E2=0 V} and {E1=−60 V and E2=0 V} in the device configuration of FIG. 2.

Figure 12:
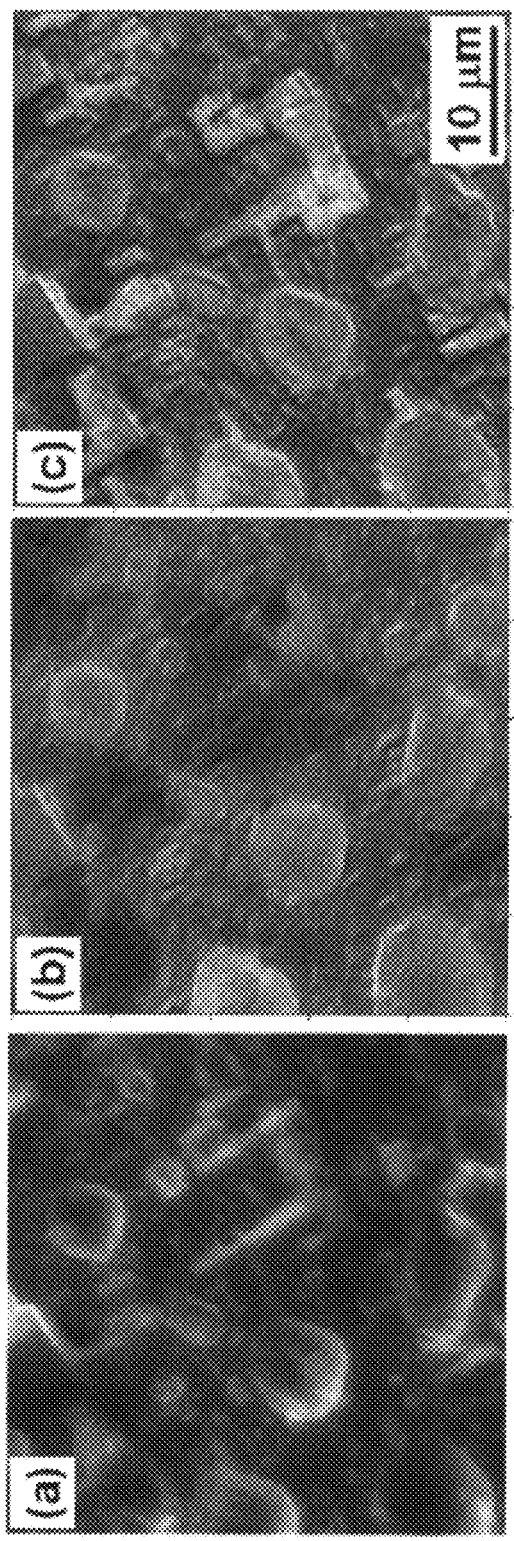
FIGS. 12(a) to 12(c) shows images obtained by subtracting data of a secondary electron image of E1=0 and E2=0 from data of the secondary electron images of other samples.

FIGS. 12(a) to 12(c) show images obtained by subtracting data of a secondary electron image of E1=0 and E2=0 from the secondary electron images (FIGS. 11(c) and 11(d)) of the sample, FIG. 12(a) is a secondary electron image in a case where an ET type detector in the related art is used as an electron detector, FIG. 12(b) is a secondary electron image (low energy secondary electron image) from 0 V to 10 V, and FIG. 12(c) is a secondary electron image from 0 V to 60 V.

It can be seen from the above that, according to the device of this embodiment, the image of the surface of the sample can be more clearly observed than the device in the related art.

Next, a second embodiment of the present invention will be described.

In the first embodiment, as described above, the low-pass filter operation is performed in the sense of the magnitude of energy, namely, selection of the low energy secondary electrons among the secondary electrons emitted from the sample. As already described, not all of the secondary electrons reach the detector, but the proportion thereof varies according to various conditions. However, a portion of the secondary electrons impinge on the wall surface of the sample chamber, and thus, SE3 electrons which are noise components losing the original information are generated. According to examination of a distribution of energy of the SE3 electrons, the energy of the SE3 electrons are greatly shifted toward the low energy side in comparison with the energy portion of the secondary electrons impinging on the wall surface. Therefore, if the electrons in the low energy side are selected by the low-pass filter operation of the first embodiment, the proportion of the noise component thereof is higher than that before the low pass filter operation is applied. Namely, the S/N ratio of the detection signal is deteriorated due to the low-pass filter operation. In order to avoid such deterioration of the S/N ratio, generation of the above-described SE3 electrons may be suppressed. In the second embodiment of the present invention, a configuration for suppressing the generation of the SE3 electrons is further added.

In the following description, since the out-lens detector is the same as that in the first embodiment, for simplifying the description, detailed configurations of the out-lens detector are omitted in description and illustration. In addition, since the configuration itself for suppressing the SE3 electrons added in the second embodiment is not based on the configuration of the out-lens detector in the first embodiment, it should be noted that the configuration for suppressing the SE electrons described hereinafter may be used together with arbitrary other forms of the out-lens detector.

Figure 13:
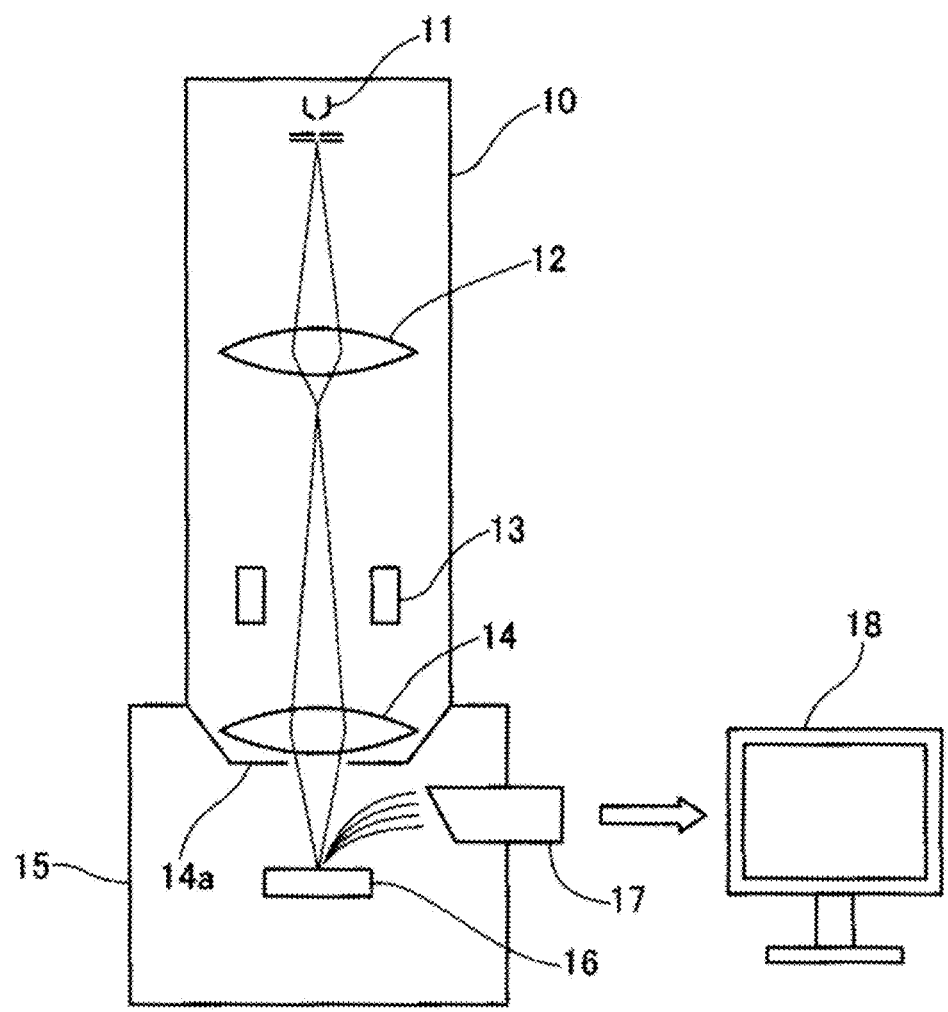
FIG. 13 is a conceptual diagram illustrating a structure of an out-lens type scanning electron microscope to which the present invention can be applied.

First, FIG. 13 schematically illustrates a configuration of an out-lens type scanning electron microscope (SEM) in the related art. As illustrated in FIG. 13, a SEM 10 comprises an electron gun 11, a focusing lens 12, a scanning coil 13, and an objective lens 14. The objective lens 14 has an objective lens outer wall 14a, and as viewed from the sample chamber 15 side, the objective lens outer wall 14a protrudes into the sample chamber 15 in a truncated conical shape. In addition, the objective lens outer wall 14a constitutes a partition wall between an electron optical system from the electron gun 11 to the objective lens 14 and the sample chamber 15. In FIG. 13, the electron optical system is illustrated to be emphasized, and thus, the objective lens 14 (the objective lens outer wall 14a) occupies most of the upper side of the sample chamber 15, but in actual cases, the upper wall of the sample chamber 15 itself has a considerable area. In addition, with respect to the potential of the wall of the sample chamber 15 discussed below, the objective lens outer wall 14a may also be treated as a portion of the wall of the sample chamber. In the sample chamber 15, a sample 16 is mounted on a stage (not illustrated), a secondary electron detector (sometimes, referred to as an out-lens detector) 17 is installed on the side surface of the sample chamber 15, and data obtained by the secondary electron detector 17 are subject to data processing by a data processing device (not illustrated). The observation result is displayed on an image device 18.

Figure 14A:
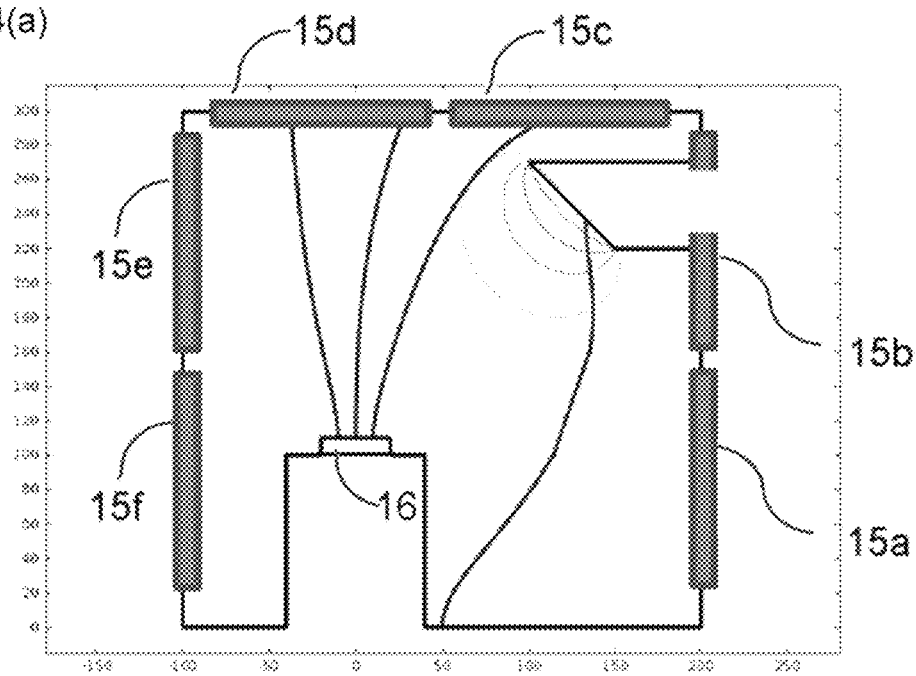
FIGS. 14(a) and 14(b) are conceptual diagrams illustrating control by an electron trajectory control mechanism in a SEM according to an embodiment of the present invention.
Figure 14B:
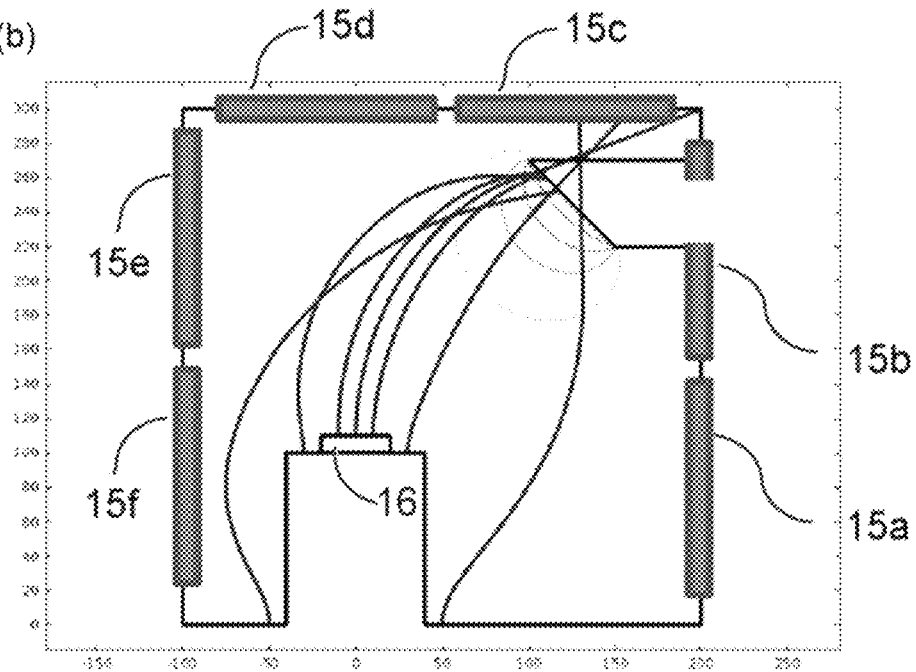

FIGS. 14(a) and 14(b) are conceptual diagrams illustrating an electron trajectory control mechanism in the SEM 10 according to this embodiment. In FIGS. 14(a) and 14(b), although an optical system of two-dimensionally scanning the sample with the electron beam generated from the electron gun 11 is omitted in illustration, the sample 16 is configured to be irradiated with the electron beam from the electron gun 11. In the embodiment, the wall of the sample chamber 15 is replaced with a plurality of electrodes 15a to 15f, and the turning on/off of the potential to be applied to each of the electrodes 15a to 15f and the magnitude of the applied potential (including plus or minus thereof) can be controlled by potential control means (not illustrated). In addition, herein, for the convenience of description, a case where the number of electrodes is six is described, but the number of electrodes may be set to an appropriate number according to the aspect of trajectory correction.

FIG. 14(a) is a diagram illustrating electron trajectories of secondary electrons before the electrode control, namely, in the state (V=0 V) where no potential V is applied to each of the electrodes 15a to 15f. It can be understood from the figure that the secondary electrons emitted from the sample 16 irradiated with the electron beam from the electron source are not directed toward the out-lens detector 17, and many secondary electrons impinge on the wall surface of the sample chamber 15. The secondary electrons impinge on the wall surface of the sample chamber 15 to be scattered or generate the SE3 electrons, and most of the generated SE3 electrons are captured by the out-lens detector 17 to be noise.

On the other hand, FIG. 14(b) is a diagram illustrating electron trajectories of secondary electrons after the electrode control, namely, in the state where a potential V is selectively applied to each of the electrodes 15a to 15f. In the example, a potential V of −100 V is applied to each of the electrodes 15b, 15d, and 15e, and the electrodes 15a, 15c, and 15f are set to V=0 V. It can be understood from the figure that the secondary electrons emitted from the sample 16 irradiated with the electron beam from the electron source are suppressed from impinging on the wall surface of the sample chamber 15 to generate the SE3 electrons, and many secondary electron trajectories are corrected so as to be directed toward the out-lens detector 17.

In addition, in FIGS. 14(a) and 14(b), no electrode is installed on the bottom surface of the wall surface of the sample chamber 15. This is because, in a typical case, most of the secondary electrons generated by the irradiation of the sample 16 with the electron beam are emitted in the upward direction or in a slanted upward direction, and thus, with respect to most of the secondary electrons, the electron trajectories can be controlled for the suppression of the generation of the SE3 electrons and the deflection of the secondary electrons toward the out-lens detector 17 without installing the electrode on the bottom surface of the sample chamber 15. Of course, in a case where the control of the secondary electrons directed toward the bottom surface of the sample chamber 15 is also required, or in a case where it is advantageous to install electrodes on the bottom surface side for controlling the electric field distribution of the entire sample chamber 15, the electrodes may be installed on the bottom surface side. In addition, in the above description, the electron trajectories are controlled by applying specific voltages to the respective electrodes inside the sample chamber. However, it should be noted that appropriate voltages to be applied to the electrodes vary with a shape or size of the sample chamber, a state of charging of the sample, or other various parameters.

If the above-described electron trajectory control is performed, many secondary electrons are effectively captured by the out-lens detector 17, and thus, it is possible to obtain a more accurate electron microscope image with sharper image contrast. In addition, as a result, it is possible to more clearly observe the microscope image using the out-lens detector which has been considered to be unclear in the related art, and the possibility of the out-lens detector is widened.

In the case of a SEM in the related art where no voltage is applied to a wall surface, in a case where there is no charging, a considerable portion of secondary electrons directed toward a detector are accelerated by the electric field around a charged sample and impinge on the wall surface to be converted into SE3 electrons. According to this embodiment, by re-bending the trajectories of the secondary electrons bent by the charging of the sample toward the detector by the voltage applied to the electrodes on the wall surface, it is possible to allow the secondary electrons to be directed toward the detector in substantially the same as a case where there is no charging. Namely, according to the present invention, even if the sample is charged, it is possible to compensate for the bending of the secondary electron trajectories and the acceleration of the secondary electrons due to the charging. As a result, it is possible to reduce the influence of the charging of the sample on the microscope image, and thus, it is possible to obtain a SEM image with high sensitivity and low noise.

Furthermore, with respect to the secondary electrons emitted from the sample, information is included in the emitting angle as well as the amount thereof. Therefore, by preventing only the electrons emitted in a specific direction from reaching the wall surface and by detecting the electrons in the out-lens detector side, in the present invention, it is also possible to detect the emitting angle information which cannot be obtained by an in-lens detector. A specific distribution of the voltages applied to the wall surface or the like for preventing only the electrons emitted in a specific direction from reaching the wall surface varies with a shape of the sample chamber, positions and number of the electrodes installed, a state of charging of the sample, emitting angles of to-be-detected electrons, energy of the electrons, or the like. However, if such specific parameters are determined, there is no particular difficulty in the calculation.

In the above-described embodiment, the wall of the sample chamber is replaced with a plurality of the electrodes, the application of the potential to each of the electrodes is controlled by the potential control means (not illustrated), and the state of the to-be-generated electric field is controlled to perform the electron trajectory control. However, according to the present invention, electrodes may be installed separately from the wall member on the wall surface of the sample chamber, and the potential thereof may be controlled, so that the trajectories of the secondary electrons for the suppression of the generation of the SE3 electrons can be corrected.

Figure 15:
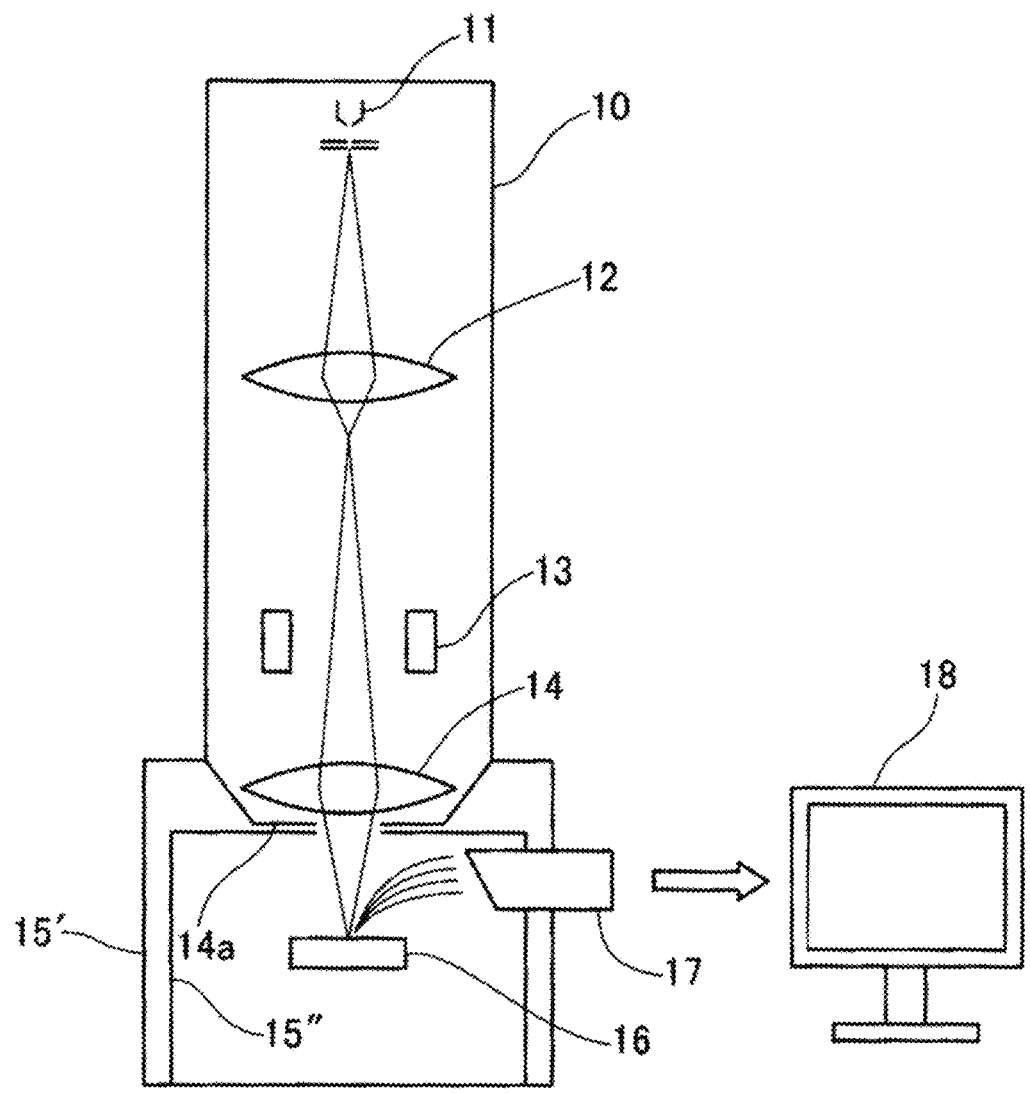
FIG. 15 is a conceptual structural diagram in a case where electrodes of the electron trajectory control mechanism are separated from a wall surface of a sample chamber in the structure illustrated in FIG. 13 and is installed inside the sample chamber.

Instead of using the inner wall itself of the sample chamber as an electrode or directly attaching the electrode to the inner wall of the sample chamber, as schematically illustrated in FIG. 15, an electrode 15" of the electron trajectory control mechanism is separated from the inner wall of an sample chamber 15' to be arranged between the wall surface of the sample chamber and the sample, and the potential thereof is controlled, so that the trajectories of the secondary electrons for the suppression of the generation of the SE3 electrons can be corrected. The electrode 15" may have, for example, a basket-shaped or a cylindrical shape or may have a partitioned shape. These shapes are configured to have a structure that does not obstruct the trajectories of the secondary electrons directed toward the out-lens detector.

In addition, the electrode of the electron trajectory control mechanism may be installed on the inner wall of the sample chamber or at a position separated from the inner wall. The electrode may not be necessarily electrically a single electrode, and by partitioning into a plurality of individual electrodes capable of independently controlling the potential, it is possible to perform fine electron trajectory control.

According to this embodiment, SEM observation of a sample charged by an electron beam such as insulator ceramics, minerals, organic substances, or living organisms is facilitated, and thus, it is possible to evaluate substances and materials that have been considered to have difficulty in using a SEM so far. In addition, by suppressing or quantitatively controlling generation of the SE3 electrons, it is possible to effectively utilize signals of the out-lens detector which has not been actively used so far for other than morphological observation. Therefore, it is possible to provide a new observation method by acquiring the image contrast caused by a minute difference in charging in the material. In addition, by controlling the electron trajectory so that only the secondary electrons having a specific emitting angle among the secondary electrons emitted from the sample are introduced into the out-lens detector, it is possible to obtain a larger amount of information from the sample.

REFERENCE SIGNS LIST 10 scanning electron microscope (SEM)
11 electron gun
12 focusing lens
13 scanning coil
14 objective lens
14a outer wall of objective lens
15 sample chamber
15a to 15f electrode (wall of sample chamber)
15' sample chamber having no electrode on inner wall
15" electrode installed to be separated from inner wall of sample chamber
16 sample
17 secondary electron detector (out-lens detector)
18 image display device
21 reflective electrode
22 electron detector
23 objective lens
24 sample
25 secondary electron
26 grid
27, 28 shield electrode
29 main electrode
30 electron detector

The invention claimed is:

1. An energy discriminating electron detector comprising:
a main electrode disposed between an energy beam radiating device radiating an electron or ion beam through an objective lens and an object emitting electrons in response to the irradiation of the ion or electron beam, the main electrode being applied with an negative voltage and being planar; and
an electron detector disposed remotely from the main electrode on the object side thereof, the electron detector detecting electrons which are those emitted from the object and reflected by the main electrode.

2. The energy discriminating electron detector according to claim 1, further comprising a shield electrode disposed at least between the main electrode and the object, the shield electrode shielding an electric field caused by the negative voltage applied to the main electrode,
wherein the shield electrode on the object side is a grid electrode.

3. The energy discriminating electron detector according to claim 2, wherein the shield electrode is disposed on either side of the main electrode.

4. The energy discriminating electron detector according to claim 1, further comprising an additional main electrode of a grid shape disposed between the main electrode and the electron detector and, in a case where a shield electrode is provided and disposed at least between the main electrode and the object, between the shield electrode on the object side and the electron detector,
wherein a negative voltage is applied to the additional main electrode.

5. The energy discriminating electron detector according to claim 1 further comprising an additional electron detector on the objective lens side of the main electrode,
wherein the main electrode is in a grid shape, and
wherein, in a case where a shield electrode is disposed on the objective lens side of the main electrode, the shield electrode is a grid-shaped electrode.

6. The energy discriminating electron detector according to claim 1, wherein the electron detector comprises a plurality of detection units.

7. The energy discriminating electron detector according to claim 1, further comprising a grid-shaped electrode in front of the electron detector, a positive voltage being applied to the grid-shaped electrode or the grid-shaped electrode being grounded.

8. The energy discriminating electron detector according to claim 1, wherein the negative voltage applied to the main electrode is a DC voltage.

9. The energy discriminating electron detector according to claim 1,
wherein the negative voltage applied to the main electrode is a DC voltage over which an AC voltage is superimposed, and
wherein an output of the electron detector is differentiatingly amplified.

10. The energy discriminating electron detector according to claim 1, wherein the main electrode reflects electrons having energy of 50 eV or less.

11. The energy discriminating electron detector according to claim 1, wherein the main electrode reflects electrons having energy of 5 eV or less.

12. The energy discriminating electron detector according to claim 1, wherein the main electrode is cut out around a region through which an electron beam or an ion beam directed toward the object in the main electrode passes.

13. A scanning electron microscope,
comprising an energy discriminating electron detector as an out-lens detector,
wherein the energy discriminating electron detector comprises:
a main electrode disposed between an energy beam radiating device radiating an electron or ion beam through an objective lens and an object emitting electrons in response to the irradiation of the ion or electron beam, the main electrode being applied with an negative voltage; and
an electron detector disposed remotely from the main electrode on the object side thereof, the electron detector detecting electrons which are those emitted from the object and reflected by the main electrode;
wherein a reflective electrode and the energy discriminating electron detector are configured to be movable in a sample chamber or the reflective electrode and the energy discriminating electron detector are detachably attached to a sample stage on which the sample is mounted; and
wherein the object is a sample to be measured.

14. The scanning electron microscope according to claim 13, comprising an optical system two-dimensionally scanning the sample with the electron beam and the sample chamber containing the sample,
wherein the scanning electron microscope further comprises an electron trajectory control mechanism modifying trajectories of the secondary electrons so as to suppress generation of SE3 electrons due to impingement of the secondary electrons emitted from the sample by irradiation of the electron beam on a wall surface of the sample chamber and to guide the secondary electrons to the out-lens detector.

15. The scanning electron microscope according to claim 14, wherein the mechanism is configured by an electrode disposed on the wall surface of the sample chamber, and the generation of the SE3 electrons is suppressed and trajectories of the secondary electrons are modified by controlling a potential of the electrode.

16. The scanning electron microscope according to claim 14, wherein the mechanism is configured by an electrode disposed in the sample chamber, and the generation of the SE3 electrons is suppressed and trajectories of the secondary electrons are modified by controlling a potential of the electrode.

* * * * *